(12) United States Patent
Lee et al.

(10) Patent No.: US 6,437,339 B2
(45) Date of Patent: Aug. 20, 2002

(54) FLAT PANEL X-RAY IMAGER WITH GAIN LAYER

(75) Inventors: Denny L. Y. Lee, West Chester, PA (US); Lawrence K. F. Cheung, Wilmington, DE (US); Andrew P. Smith, Medford, MA (US)

(73) Assignee: Hologic, Inc., Bedford, MA (US)

( * ) Notice: Subject to any disclaimer, the term of this patent is extended or adjusted under 35 U.S.C. 154(b) by 0 days.

(21) Appl. No.: 09/815,433

(22) Filed: Mar. 22, 2001

Related U.S. Application Data

(60) Provisional application No. 60/191,943, filed on Mar. 24, 2000.

(51) Int. Cl.[7] .................................................. H01J 31/26
(52) U.S. Cl. ............................ 250/370.09; 250/370.11; 250/591; 250/374; 313/526; 313/527; 313/366; 313/367
(58) Field of Search ........................ 250/370.09, 370.11, 250/591.374; 313/526, 527, 366, 367

(56) References Cited

U.S. PATENT DOCUMENTS

| | | | | |
|---|---|---|---|---|
| 5,005,195 A | * | 4/1991 | Lanza et al. ........... 250/370.09 |
| 5,233,265 A | * | 8/1993 | Takasaki et al. ............. 313/366 |
| 5,319,206 A | | 6/1994 | Lee et al. | |
| 5,321,334 A | * | 6/1994 | Kinoshita et al. ........... 313/366 |

OTHER PUBLICATIONS

John David Jackson, *Classical Electrodynamics* 2nd Edition Wiley 1962, pp. xv–xxii and 146.
P.W. Nicholson, *Nuclear Electronics*, Wiley 1974, pp. ix–xiv and 17–19.

* cited by examiner

*Primary Examiner*—Constantine Hannaher
*Assistant Examiner*—Andrew Israel
(74) *Attorney, Agent, or Firm*—Cooper & Dunham LLP

(57) ABSTRACT

A flat panel x-ray imager includes a gain layer (charge multiplication layer) that facilitates imaging at low x-ray exposure levels. The gain layer can be a gas chamber or a solid state material operating in an avalanche mode.

37 Claims, 3 Drawing Sheets

FLAT PANEL X-RAY IMAGER WITH GAIN LAYER

REFERENCE TO RELATED APPLICATION

This present application claims the benefit of provisional Application Ser. No. 60/191,943, filed on Mar. 24, 2000, which is hereby incorporated herein by reference.

FIELD

This patent specification is in the field of radiography and pertains more specifically to x-ray imaging using a digital flat panel detector.

BACKGROUND

Flat panel x-ray imaging devices that generate electrical signals related to local x-ray exposure have been developed in recent years. An example is discussed in U.S. Pat. No. 5,319,206, the contents of which are hereby incorporated by reference, and a current version is commercially available from the assignee of this patent specification. These panels offer good spatial resolution and dynamic range properties and can replace x-ray film in a variety of radiographic procedures, such as, without limitation, chest x-ray imaging. However, when the exposure level is much lower than used for procedures such as chest x-rays, for example at the low exposures used for procedures such as real-time fluoroscopy, electronic noise and other adverse characteristics can detract from optimal performance of these flat panel devices. In addition, in certain applications other that real-time fluoroscopy, such as in procedures where it is particularly important to reduce patient x-ray dosage, it may also be desirable to image at lower than conventional x-ray exposure levels.

Real-time fluoroscopic radiation exposures can be 10 to 1000 times lower than typical radiographic exposures such as chest x-rays. Image intensifiers are commonly used in these low-exposure applications, and because of their high gain they can generate an acceptable signal-to-noise performance even at very low x-ray exposure levels. Image intensifiers unfortunately have undesirable properties, such as spatial distortions, poor contrast, and are heavy and large.

Because of other advantages of flat-panel detectors used as imagers, there exists a need for a flat-panel device that can operate with high performance at the very lowest x-ray exposure levels. There also exists a need for a flat panel device to operate at these low x-ray exposure (dose) levels that is also capable of generating many images per second for real-time imaging. There also exists a need for a flat panel device that operates at these low dose levels that does not have spatial distortions and other imaging non-uniformities and that is small and lightweight as compared with an image intensifier of a comparable image plane size.

SUMMARY

The flat panel x-ray imaging device such as disclosed in U.S. Pat. No. 5,319,206 comprises an image charge generation layer such as selenium, and a flat panel thin film transistor layer with a multiplicity of pixels and signal control and output lines. A pixel includes a charge collector, image charge storage capacitor, and field effect transistor. (The term pixel is used here to denote a portion of the flat panel detector that can generate an electrical signal for a positionally corresponding display pixel on a screen displaying an x-ray image.) The x-ray detection lower limit of such a device depends to a large extent on the charge signal generated from the incoming x-rays and the level of electronic noise in the readout circuit.

Such a flat panel device can be enhanced to improve its ability to image at low x-ray exposure through enhancing the charge signal produced from the incoming x-ray and therefore increasing the sensitivity of image formation and producing a radiation image from a very low level of radiation. This can be done through the use of a gain or charge multiplication layer in addition to known layers of a flat panel detector, as described in greater detail below.

DETAILED DESCRIPTION OF PREFERRED EMBODIMENTS

Figure 1:
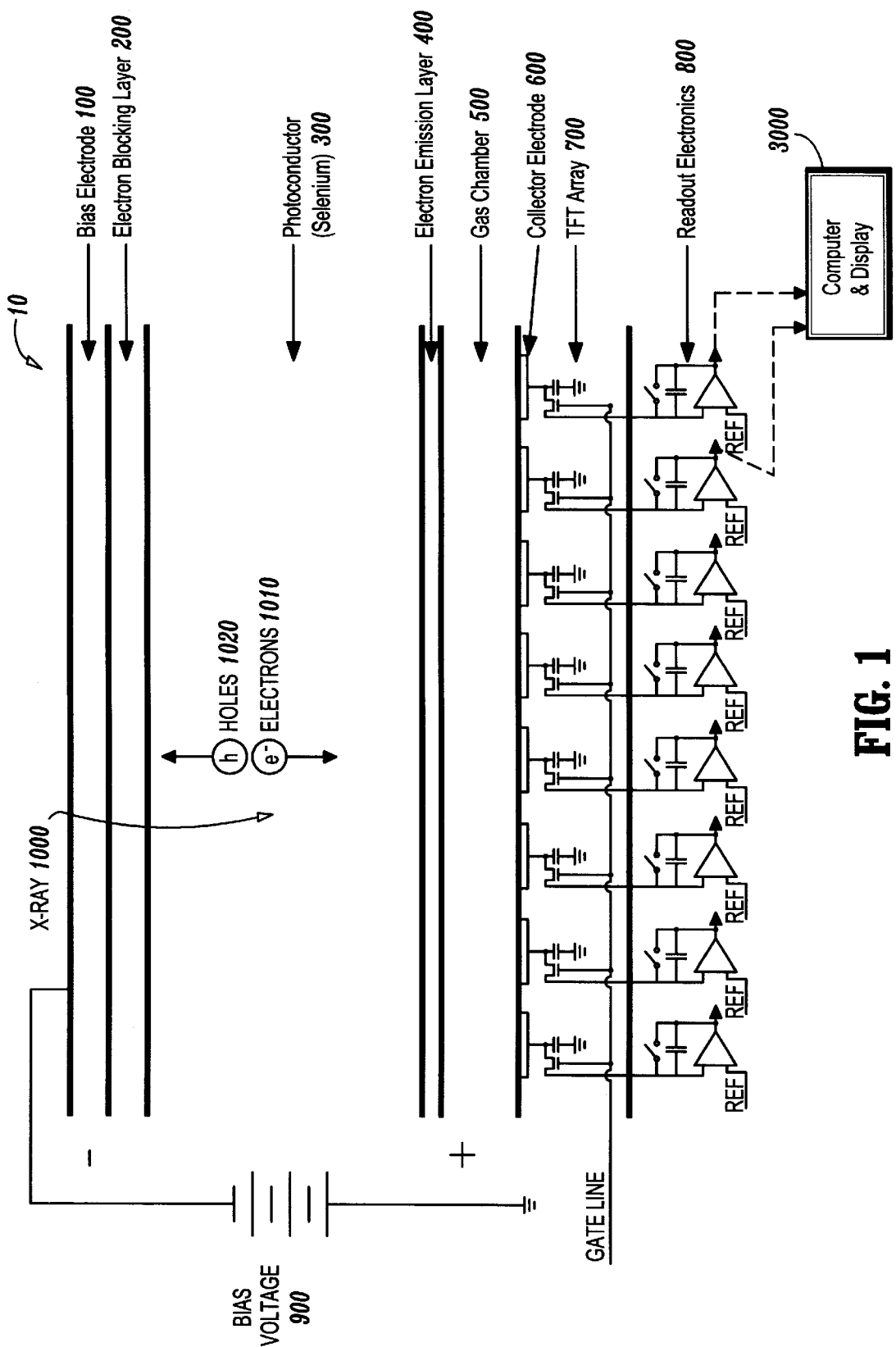
FIG. 1 illustrates a flat-panel x-ray detector with an x-ray-absorbing photoconductor layer and a gain layer using a gas chamber proportional chamber for charge gain.

FIG. 1 illustrates one preferred embodiment in which a basic structure of a flat panel imager 10 comprises the following layers:

1. An x-ray transparent bias electrode 100;
2. An x-ray transparent electron blocking layer 200;
3. A charge generation layer 300, comprising a photoconducting material such as selenium or other suitable photoconducting material. Layer 300 can comprise, for example, amorphous selenium, $PbI_2$, CdTe, CdZnTe, TlBr, $HgI_2$, silicon, germanium, $PbO_2$, with or without doping materials, and combinations or subcombinations thereof. It is also possible to use, in place of layer 300, the combination of a scintillator layer and a photoelectron emission layer (e.g., $SbCs_3$) to achieve local conversion of x-rays to an electrical signal;
4. A thin charge (electron) emission layer 400 comprising a material with a low work function such as barium oxide or another suitable material having a low work function. Preferably, this material should be electrically insulating, or a poor conductor of electricity. If not, it can be divided into patches that correspond to pixel positions and are substantially electrically insulated from each other. In certain embodiments, depending on the materials chosen for the layers above and below, layer 400 may not be needed, or may be replaced or augmented by a separation layer that prevents undesirable interactions between layers;
5. A gain or charge multiplication layer 500, which in this embodiment comprises a thin gas chamber filled with a mixture of approximately 90% argon gas and 10% methane gas, although another suitable gas or gas mixture can be used that has comparable charge multiplication properties. For example, liquid or pressurized xenon can be used, or a solid state charge multiplier can be used (as described in connection with another preferred embodiment below), or a microchannel plate charge multiplier can be used, or another device carrying out a similar function can be used;
6. A thin film transistor (TFT) array comprising a multiplicity of pixel charge collectors 600, image forming transistor/capacitor circuits 700;

7. Readout electronics 800 similar to those in prior art flat panel imagers; and
8. A source of bias voltage 900.

The preferred embodiment illustrated in FIG. 1 is understood to operate as follows. A negative electrical bias potential 900 is applied across the structure. In the case of using selenium as the photoconductor layer 300, an electric field of approximately 5 to 15 volts per micron(V/$\mu$m) is typically used. According to Maxwell's Equations (see, e.g., J D Jackson, *Classical Electrodynamics*, $2^{nd}$ Ed. Wiley 1975), the electric field in the gas layer 500 will be K1/K2 times higher than the field in the photoconductor selenium layer 300, where K1 is the dielectric constant of selenium (~6.6) and K2 is the dielectric constant of the gas mixture (~1).

In the presence of the electric field in the photoconductor 300, x-ray energy 1000 absorbed in the selenium 300 will generate electron-hole pairs 1010 & 1020, with the electrons 1010 drifting across the selenium layer 300 to reach the charge emission layer 400. The charge emission layer 400 is a layer of material such as barium oxide with a low work function such as from 0.3 eV to 1.5 eV and, as earlier indicated, preferably is electrically non-conductive or a poor conductor, or is divided into patches matching pixel positions and electrically insulated from each other. Those electrons that have reached this charge (electron) emission layer 400 and have acquired sufficient energy from the bias electric field to exceed the work function energy will traverse the emission layer and escape its lower surface to enter the gas chamber 500.

Upon entering the gas chamber 500, the electrons are accelerated by the stronger electric field in the chamber to collide with atoms of the inert gas such as argon gas. The collision with the inert gas will produce more free electrons that are accelerated in the chamber 500, thus producing a charge multiplication effect. The physics of such a gas chamber is known to scientists in the field of nuclear instruments as a proportional counter. See, e.g., P W Nicholson, *Nuclear Electronics*, Wiley 1974, hereby incorporated by reference. The magnitude of charge multiplication can be controlled by varying the gas mixture, the gas pressure, and the applied field across the gas chamber as well as across the photoconductor layer, as in known in the art of proportional counters. A multiplication factor such as 10 to 100 can be desirable for single x-ray photon detection and quantum-limited imaging.

The image charge after such a multiplication through gas chamber 500 is collected by the collector electrode 600 and the thin film transistor (TFT) structure 700, and subsequently readout as an image by the readout electronics 800 and processed into an image by an associated computer 3000 that can include a suitable display for a resulting x-ray image, as known in the art of flat panel x-ray imagers.

The electron blocking layer 200 is a material that allows the passage of the holes 1020 into the bias electrode 100 but impedes the injection of electrons from the bias electrode 100 into the photoconductor 300. This structure reduces the magnitude of the dark current that flows in the device in the absence of x-ray illumination. The flow of hole current generated from the x-ray absorption through this layer helps prevent charge buildup and facilitates the construction of a device allowing continuous imaging.

The separation of the gain stage 500 from the charge generation stage 300 makes for a signal gain that is independent of the position of absorption of the x-ray in photoconductor 300. The charge gain that occurs in the gas chamber layer 500 allows the imaging of very low levels of radiation.

As a practical example of how to construct a device such as illustrated in FIG. 1, layer 300 can be amorphous selenium, biased at 10 V/$\mu$m electric field. A thin (~1 $\mu$m) electron emission layer 400 of barium oxide provides a barrier preventing the escape of the gas in the chamber 500. A thickness of the gas chamber of 20 $\mu$m would provide a gain of approximately 10 in the presence of the 66 V/$\mu$m electric field, when the gas (90% argon gas and 10% methane) is filled to a pressure of about 1.4 atmospheres. A pressure of 1.4 atmospheres will approximately balance the electrostatic attraction force between the collector electrode layer and the electron emission layer. Different pressures can be used if desired.

Figure 2A:
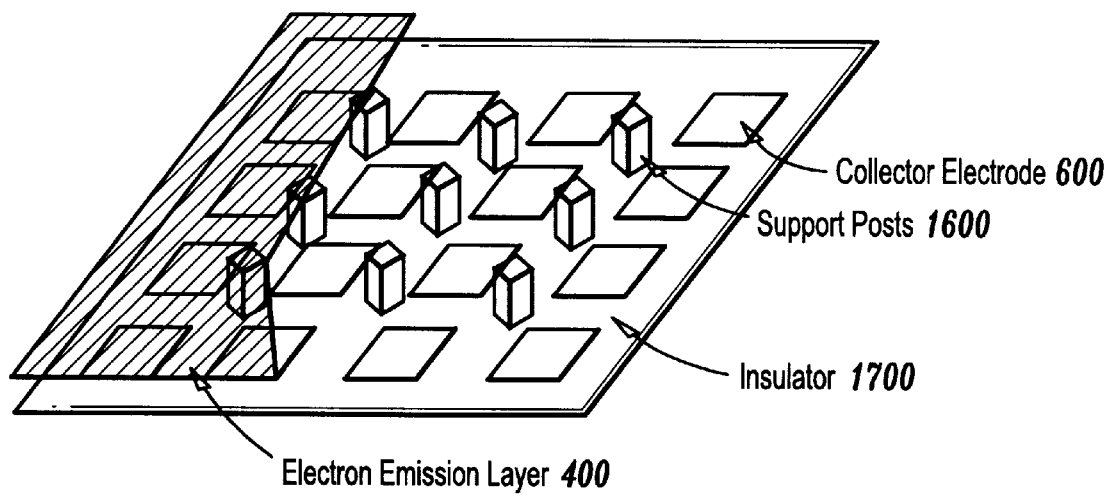
FIGS. 2a and 2b illustrate two examples of support structures used to separate at a fixed distance an electron emission layer from a collector electrode in a flat panel imager.
Figure 2B:
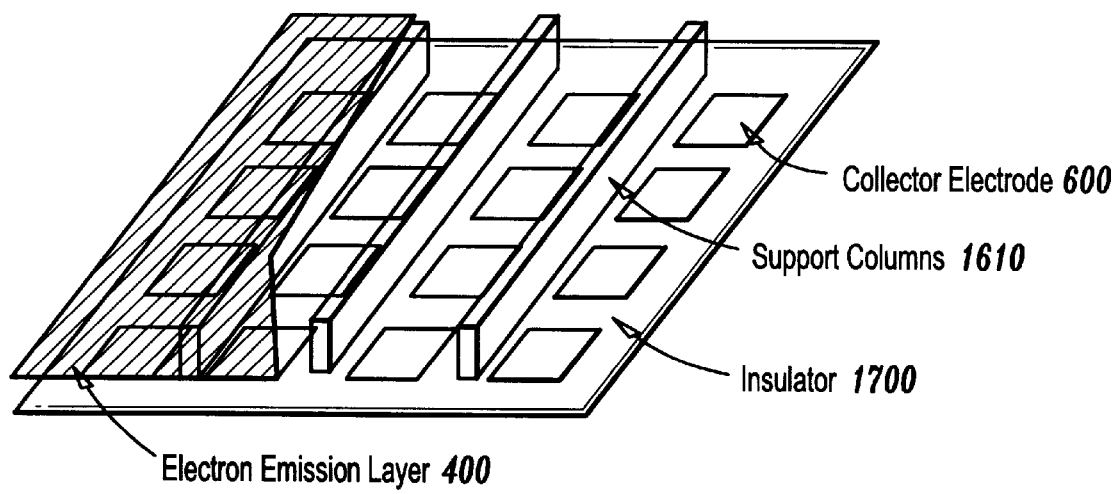

Construction of the device and device reliability can be facilitated by manufacturing small support posts 1600 that extend from the plane of the collector electrodes 600 to the electron emission layer 400. See FIG. 2a. These posts 1600 can comprise an insulating material deposited using photolithography, with the base of each post 1600 attached in a 10 $\mu$m insulating spacing 1700 typically used between collector electrodes 600. The tops of the posts 1600 support the electron emission layer 400. An alternative to posts can be walls 1610, as illustrate in FIG. 2b, or some other support structure that provides the desired mechanical support function but does not adversely affect imaging performance.

Figure 3:
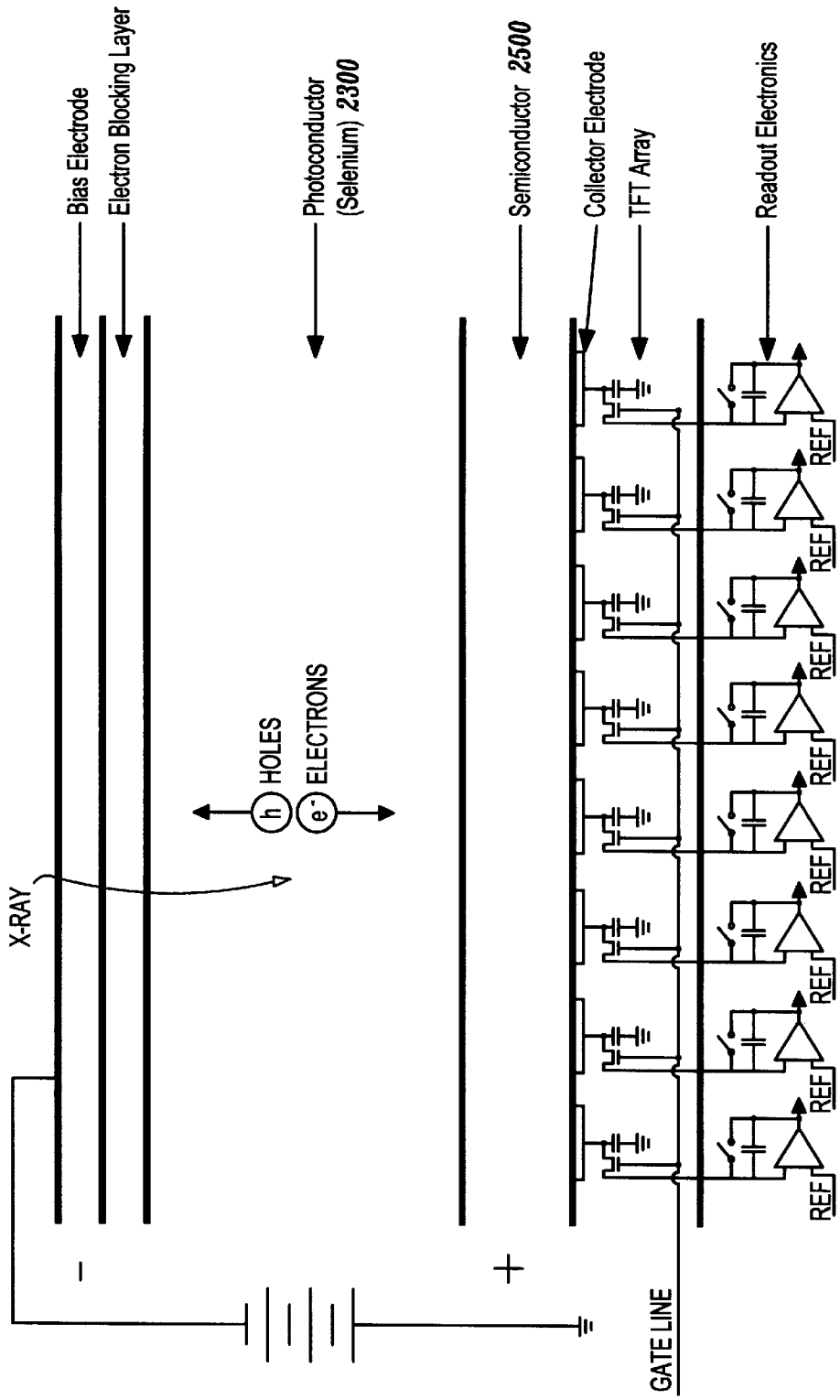
FIG. 3 illustrates a flat-panel x-ray imager with an x-ray-absorbing photoconductor layer and a gain layer using a material such as a photoconductor biased in the avalanche mode.

An alternative preferred embodiment of a flat panel imager 10, illustrated in FIG. 3, is otherwise similar to the embodiment illustrated in FIG. 1 but uses a solid semiconductor 2500 in place of the electron emission layer 400 and the gas chamber 500. The photoconductor layer is labeled 2300 in this embodiment, and carries out a function similar to that of layer 300 in the embodiment illustrated in FIG. 1. In the embodiment of FIG. 3, the material for layer 2500 is chosen so that the electric field strength in the material is sufficient to bias the material in the avalanche mode. This is known in nuclear electronics as a solid-state proportional counter. See, e.g., P W Nicholson, *Nuclear Electronics*, Wiley 1974. Electrons accelerating in this material 2500 generate additional charges and thus gain similarly to the operation in the gas chamber 500. The electric field in the material 2500 will be given by K1/K2 of the field strength in the photoconductor 2300, where K1 is the dielectric constant of the photoconductor layer 2300 and K2 is the dielectric constant of the gain layer 2500.

For example, amorphous selenium can be used as the photoconductor 2300 and another material such as $HgI_2$ can be used as the gain layer 2500. The amorphous selenium layer can be biased with a typical field strength of, for example, ~10 V/$\mu$m. With suitable deposition and sample preparation $HgI_2$ can be made with similar dielectric constant as the selenium layer 2300 and will have a similar electric field strength of, for example, 10 V/$\mu$m. This can be sufficient to operate the gain layer 2500 in the avalanche mode. Other materials can be chosen for layers 2300 and 2500, as long as the field strength in the gain layer is sufficiently high to create a charge gain.

One advantage of a device where the gain multiplication occurs separately from the original charge generation is that the signal gain is substantially independent of the position of absorption of the x-ray, although it is true that the energy with which charges arrive at the gain region 2500 (or 500 in the earlier embodiment can differ). X-rays absorbing anywhere within the thickness of the photoconductor 2300 create charges that drift to the amplifier region 2500. They are then accelerated across a constant thickness of layer 2500, resulting in a constant charge multiplication. X-rays absorbed in the second layer 2500 and generating charges create a depth-dependent gain; absorption near the entrance surface of layer 2500 can create a larger gain than absorption near the collector electrodes 600. If the absorption cross-section of the gain layer 2500 is much smaller than that of the photoconductor (charge generation) layer 2300, there will be negligible absorption in the second layer and a negligible depth-dependent gain. This can be controlled, for example, by making layer 2500 much thinner than layer 2300, or making layer 2500 of a material of much lower atomic number so its x-ray cross section is lower. The system in FIG. 1 has a similarly negligible x-ray absorption cross-section in layer 500 because the density of the gas chamber layer 500 is much lower than the density of the photoconductor layer 300, and thus does not have a significant depth-dependent gain.

While specific preferred embodiments have been described above as examples of the improvements disclosed in this patent specification, it should be understood that many variations are possible. As some non-limited examples, additional layers can be used in the flat panel imager, or different materials can be used for the layers, layers can be omitted so long as a gain or charge multiplication is still achieved, and the bias voltage can be the opposite of that used in the preferred embodiments described above. The flat panel image can be of any desired size and shape, and need not even be absolutely planar, so long as it is relative thin as compared with the combination of a scintillator and an image intensifier known in the art as an x-ray imager. While the term x-rays has been used above, it should be clear that the term is intended to include other ionizing radiation as well such as, for example, gamma rays.

The electric field in the examples above is higher in the gain layer than in the charge generator layer, but in case of other materials for these layers, the electric fields may be the same, or the field in the charge generator layer may be higher.

What is claimed is:

1. A flat panel x-ray imager comprising:
    a charge generator layer locally generating electrical charges in response to x-ray exposure;
    a gain layer receiving electrical charges generated in the charge generator layer and locally multiplying received charges; and
    a charge collector locally collecting electrical charges multiplied by the gain layer to produce electrical signals related to local x-ray exposure of the charge generator layer;
    wherein said gain layer has an x-ray absorption cross-section smaller than that of the charge generator layer.

2. A flat panel x-ray imager comprising:
    a charge generator layer locally generating electrical charges in response to x-ray exposure;
    a gain layer receiving electrical charges generated in the charge generator layer and locally multiplying received charges; and
    a charge collector locally collecting electrical charges multiplied by the gain layer to produce electrical signals related to local x-ray exposure of the charge generator layer;
    including a charge emission layer interposed between the charge generator layer and the gain layer.

3. A flat panel x-ray imager as in claim 1 in which the gain layer comprises a gas-filled chamber.

4. A flat panel x-ray imager comprising:
    a charge generator layer locally generating electrical charges in response to x-ray exposure;
    a gain layer receiving electrical charges generated in the charge generator layer and locally multiplying received charges; and
    a charge collector locally collecting electrical charges multiplied by the gain layer to produce electrical signals related to local x-ray exposure of the charge generator layer;
    in which the gain layer comprises a gas-filled chamber; and;
    in which the gas filled chamber is filled with a mixture of approximately 90% argon land 10% methane.

5. A flat panel x-ray imager comprising:
    a charge generator layer locally generating electrical charges in response to x-ray exposure;
    a gain layer receiving electrical charges generated in the charge generator layer and locally multiplying received charges; and
    a charge collector locally collecting electrical charges multiplied by the gain layer to produce electrical signals related to local x-ray exposure of the charge generator layer;
    including a biasing arrangement producing an electrical field in the charge generator layer and in the gain layer, and wherein the field is higher in the gain layer than in the charge generator layer.

6. A flat panel x-ray imager as in claim 1 in which the gain layer comprises a solid state material.

7. A flat panel x-ray imager as in claim 6 in which the gain layer comprises a solid state material operating in an avalanche mode.

8. A flat panel x-ray imager as in claim 1 in which the charge generator layer comprises a scintillator layer and an electron emission layer.

9. A flat panel x-ray imager as in claim 1 in which the charge generating layer comprises one or more of amorphous selenium, $PbI_2$, CdTe, CdZnTe, TlBr, $HgI_2$, silicon, germanium, $PbO_2$, and doping materials.

10. A flat panel x-ray imager as in claim 1 in which the gain layer comprises a microchannel plate.

11. A flat panel x-ray imager as in claim 1 in which the gain layer comprises a chamber filled with a substance comprising xenon.

12. A flat panel x-ray imager as in claim 11 in which the xenon is in liquid form.

13. A method of imaging x-rays comprising:
    receiving x-rays at a charge generator layer locally generating electrical charges in response to x-ray exposure;
    locally receiving at a gain layer electrical charges generated by the charge generating layer and locally multiplying charges received at the gain layer to thereby produce locally multiplied electrical charges; and
    locally collecting electrical charges multiplied by the gain layer to produce electrical signals related to local x-ray exposure at the charge generator layer;
    said receiving and multiplying charges comprising receiving and multiplying at a gain layer having a smaller x-ray absorption cross-section than the charge generator layer.

14. A method of imaging low exposure level x-rays comprising:
    receiving x-rays at a charge generator layer locally generating electrical charges in response to x-ray exposure;
    locally receiving at a gain layer electrical charges generated by the charge generating layer and locally multiplying charges received at the gain layer to thereby produce locally multiplied electrical charges suitable for low x-ray exposure level imaging; and locally collecting electrical charges multiplied by the gain layer to produce electrical signals related to local x-ray exposure at the charge generator layer;

said receiving and multiplying charges comprising receiving and multiplying at a gain layer having a smaller x-ray absorption cross-section than the charge generator layer.

15. A method of imaging low exposure level x-rays suitable for real-time fluoroscopy comprising:

receiving x-rays at a charge generator layer locally generating electrical charges in response to x-ray exposure;

locally receiving electrical charges generated by the charge generating layer and locally multiplying charges received at the gain layer to thereby produce locally multiplied electrical charges suitable for low x-ray exposure level imaging in real-time fluoroscopy; and locally collecting electrical charges multiplied by the gain layer to produce electrical signals related to local x-ray exposure at the charge generator layer;

said receiving and multiplying charges comprising receiving and multiplying at a gain layer having a smaller x-ray absorption cross-section than the charge generator layer.

16. A method as in claim 15 in which said receiving and multiplying charges comprises receiving and multiplying at a gain layer having a sufficiently smaller x-ray absorption cross-section than the charge generator layer to achieve an insignificant depth-dependent gain.

17. A method as in claim 15 in which said receiving and multiplying charges comprises receiving and multiplying at a gain layer having negligible x-ray absorption compared with the charge generator layer.

18. A method as in claim 15 in which said receiving and multiplying charges comprises receiving and multiplying at a gain layer having negligible depth-dependent gain.

19. A method as in claim 15 in which said receiving and multiplying charges comprises receiving and multiplying at a gain layer thinner than the charge generator layer.

20. A method as in claim 15 in which said receiving and multiplying charges comprises receiving and multiplying at a gain layer sufficiently thinner than the charge generator layer to achieve an insignificant depth-dependant gain.

21. A method as in claim 15 in which said receiving and multiplying charges comprises receiving and multiplying at a gain layer having lower atomic number than the charge generator layer.

22. A method as in claim 15 in which said receiving and multiplying charges comprises receiving and multiplying at a gain layer having sufficiently lower atomic number than the charge generator layer to achieve an insignificant depth-dependent gain.

23. A flat panel x-ray imager as in claim 1 in which the gain layer has sufficiently smaller x-ray absorption cross-section than the charge generator layer to achieve an insignificant depth-dependent gain.

24. A flat panel x-ray imager as in claim 1 in which the gain layer has negligible x-ray absorption compared with the charge generator layer.

25. A flat panel x-ray imager as in claim 1 in which the gain layer has negligible depth-dependent gain.

26. A flat panel x-ray imager as in claim 1 in which the gain layer is thinner than the charge generator layer.

27. A flat panel x-ray imager as in claim 1 in which the gain layer has lower atomic number than the charge generator layer.

28. A flat panel x-ray imager as in claim 1 in which the gain layer has sufficiently lower atomic number than the charge generator layer to achieve an insignificant depth-dependent gain.

29. A flat panel x-ray imager comprising:

a charge generator layer locally generating electrical charges in response to x-ray exposure;

a gain layer receiving electrical charges generated in the charge generator layer and locally multiplying received charges; and a charge collector locally collecting electrical charges multiplied by the gain layer to produce electrical signals related to local x-ray exposure of the charge generator layer;

wherein said gain layer is thinner than said charge generator layer.

30. A flat panel x-ray imager as in claim 29 in which the gain layer has smaller x-ray absorption cross-section than the charge generator layer.

31. A flat panel x-ray imager as in claim 29 in which the gain layer has sufficiently smaller x-ray absorption cross-section than the charge generator layer to achieve an insignificant depth-dependent gain.

32. A flat panel x-ray imager as in claim 29 in which the gain layer has negligible x-ray absorption compared with the charge generator layer.

33. A flat panel x-ray imager as in claim 29 in which the gain layer has negligible depth-dependent gain.

34. A flat panel x-ray imager as in claim 29 in which the gain layer has lower atomic number than the charge generator layer.

35. A flat panel x-ray imager as in claim 29 in which the gain layer has sufficiently lower atomic number than the charge generator layer to achieve an insignificant depth-dependent gain.

36. A flat panel imager as in claim 29 in which the gain layer has lower density than the charge generator layer.

37. A flat panel imager as in claim 29 in which the gain layer has sufficiently lower density than the charge generator layer to achieve an insignificant depth-dependent gain.

* * * * *